United States Patent [19]

Serge

[11] Patent Number: 4,602,858
[45] Date of Patent: Jul. 29, 1986

[54] LASER DIODE MARKER FOR HIGH SPEED CINEMATOGRAPHY

[75] Inventor: Gidon Serge, Voiron, France

[73] Assignee: Commissariat a l'Energie Atomique, Paris, France

[21] Appl. No.: 667,354

[22] Filed: Nov. 1, 1984

[30] Foreign Application Priority Data

Nov. 9, 1983 [FR] France ................. 83 17812

[51] Int. Cl.[4] ................. G03B 41/00; G03B 21/50
[52] U.S. Cl. ....................... 352/84; 352/39; 352/92
[58] Field of Search ............. 352/92, 84, 39; 355/40; 354/105

[56] References Cited

U.S. PATENT DOCUMENTS

| | | | |
|---|---|---|---|
| 3,044,068 | 7/1962 | Hull et al. | 352/39 |
| 3,449,046 | 6/1969 | White | 352/92 |
| 3,603,974 | 9/1971 | Copeland | 346/23 |
| 3,858,063 | 12/1974 | Saleme | 307/311 |
| 4,400,812 | 8/1983 | Clark | 372/29 |

FOREIGN PATENT DOCUMENTS 2820908 11/1978 Fed. Rep. of Germany.

OTHER PUBLICATIONS

Proceeding of the Ninth International Congress on High Speed Photography, 2-7 aout 1970, Denver, Colo. (US) SMPTE, N.Y. (US), F. Chabannes et al: "Application of Phase-Locked Solid Lasers to High-Speed Cinematography", pp. 68-74, p. 70, colonne de droite, lignes 5-20; p. 71, colonne de gauche, lignes 54-59; paragraphe VI, p. 73.

Feinwerktechnik & Messtechnik, vol. 89, No. 5, juillet-/aout, 1981, Munich (DE) M. Fabian: "Pulsschaltungen fur Laserdioden", pp. 225-228, FIGS. 11, 13, 14.

*Primary Examiner*—Monroe H. Hayes

[57] ABSTRACT

Laser diode marker for high speed cinematography.

It comprises a power laser diode operating in pulse-like manner, electronic control means of the laser diode enabling the latter to emit a light signal and means for transmitting the latter to a photosensitive circuit with which the camera used is provided.

Application to the time marking of events.

13 Claims, 7 Drawing Figures

LASER DIODE MARKER FOR HIGH SPEED CINEMATOGRAPHY

BACKGROUND OF THE INVENTION

The present invention relates to a laser diode marker for high speed cinematography which is more particularly used for the time marking of events.

It is known that high speed cinematography is a technique consisting of filming, by means of a suitable camera, an event having a very short duration, which can be a few dozen microseconds or less.

In order to study such an event, following the recording thereof on a photosensitive support or film with which the camera has been equipped, it is necessary to mark one or more particular instants, which are synchronous with the event, e.g. instants separated from one another by the same time interval, by marking the photosensitive support using light signals synchronous with these particular instants.

For this purpose, it is possible to use a device called a marker, which comprises a light-emitting diode, whose emitted radiation is in the near infrared range, associated with an electronic camera having a tube equipped with a photodiode of type S 20 or S 20R.

Such a marker suffers from the disadvantage of leading to pale and unusable recordings, bearing in mind the low radiance of the lighting source used and the fact that the photocathode used is only slightly sensitive to the near infrared.

SUMMARY OF THE PRESENT INVENTION

The object of the invention is to obviate this disadvantage.

It therefore specifically relates to a marker for a high speed cinematographic camera wherein it comprises at least one power laser diode operating in pulse-like manner, electronic means for controlling each laser diode, enabling the latter to emit a light signal and means for transmitting this light signal to a photosensitive surface with which the camera is equipped.

The marker according to the invention makes it possible to obtain much better contrasted recordings than those obtained with the aforementioned known marker, because it uses a laser diode having a much higher radiance than that of a light-emitting diode and which is consequently much more suited to high speed cinematography which requires a high lighting power in view of the speed with which the studied events take place.

Such a laser diode is also much more powerful than light-emitting diodes and continuous laser diodes, which are only able to supply a lighting power of a few milliwatts, whereas a power laser diode operating in pulse-like manner is able to emit several watts. Admittedly this emission takes place during a very short time, (a few hundred nanoseconds), as compared with light-emitting diodes and conventional laser diodes, whose emission can be continuous, but this is not prejudicial in view of the short duration of the events filmed by high speed cinematography.

The maximum duration of a light pulse which can be emitted by a power laser diode operating in pulse-like manner remains compatible with the duration of the events studied by high speed cinematography. Thus, a conventional use of a power laser diode operating in pulse-like manner in fields other than high speed cinematography is based on the production of a light pulse of a few hundred nanoseconds using such a diode and then possibly other identical light pulses, whilst waiting for a sufficient time between the pulses so as to not damage the diode. In the present invention, the aforementioned so-called monopulse operation is possible with events lasting e.g. a few milliseconds, but, in view of the extremely high speed of the events studied by high speed cinematography, in a preferred and original manner the present invention makes use of a power laser diode in multipulse operation i.e. by associating the laser diode with control means making it possible to obtain a plurality of light pulses, whereof the sum of the durations is at least equal to the conventionally obtained single pulse, so as not to damage the diode. Everything takes place as if a single light pulse were subdivided into a plurality of appropriately spaced, successive light pulses. Thus, it is possible to cover a complete studied phenomenon, whereof the duration is e.g. roughly 10 microseconds. Moreover, this gives not only a very intense marker, but also a very accurate marker.

For example, the power laser diode used has a simple heterostructure. The camera is, for example, an electronic camera provided with a slit for defining the optical field thereof and which has a photosensitive surface exposed to the field defined by the slit.

In this case, according to a special embodiment of the invention, the laser diode is placed in the field defined by the slit and at the border of said field, and the transmission means have optics for focusing the light signal through the slit on to the photosensitive surface.

Here again, according to a special embodiment, the transmission means comprise an optical fibre whereof one end is optically coupled to the laser diode and whose other end is optically coupled to the photosensitive surface at the border of the field defined by the slit.

For example, it would be possible to use an ultraviolet-sensitive, slit electronic camera, the laser diode then emitting in the ultraviolet.

The camera can also be a mechanooptical camera provided with a slit for defining the optical field thereof, the laser diode then being selected in such a way that it emits light belonging to the visible region of the electromagnetic spectrum.

With said other type of camera having a rotary mirror able to reflect the image of the field defined by the slot on to a photosensitive support or a film which, in this case, constitutes the said photosensitive surface, the laser diode can be placed in the border of said field, the transmission means then having optics for focusing the light signal on to the photosensitive support via the rotary mirror.

According to a special embodiment of the invention, the electronic control means comprise means for producing a given number of high intensity electric pulses, whereof the sum of the durations at the most equal to the maximum duration of a light pulse which the laser diode is able to emit.

In this case and with the camera serving to film an event, the electronic control means can comprise:
- means for synchronizing the operation of the laser diode with the start of the event,
- an electric pulse generator,
- a pulse counter controlled by the synchronization means dependent on the pulse generator and controlling the same, in such a way that the pulse generator produces a given number of pulses, whereof the sum of the durations is at the most equal to the maximum duration of a light pulse which the laser diode is able to emit and stops once this number has been produced, and a power amplifier for amplifying the pulses from the pulse generator, the amplified pulses being transmitted to the laser diode.

According to another special embodiment, the camera serving to film an event, the electronic control means can comprise:

means for synchronizing the operation of the laser diode with the start of the event, at least one regulatable monostable electric pulse generator, each monostable generator having input connected to the synchronization means, and being regulated so as to emit at a given moment, following the start of the event, an electric pulse of an appropriate duration and in such a way that the sum of the durations of the pulses emitted by the monostable generators is at the most equal to the maximum duration of a light pulse which the laser diode is able to emit, and a power amplifier whose input is connected to the output of each monostable generator and whose output is connected to the laser diode.

Finally, in a preferred embodiment, the power amplifier comprises a power transistors of the HMOS or VMOS type, for amplifying the electric pulses received at its input.

This power amplifier can successively comprise an impedence matching gain stage, a follower source impedence lowering stage and a current gain supply stage, the last two stages being realized with the aid of said power transistors.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
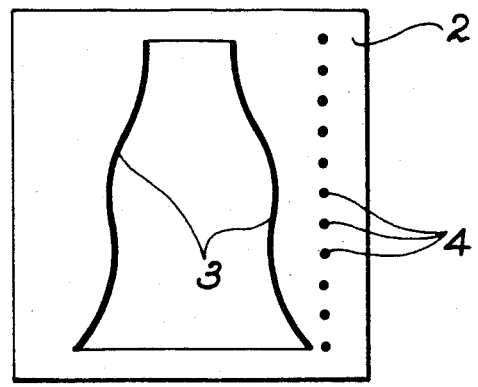
FIG. 1 a diagrammatic view of a high speed cinematographic recording of an event incorporating marks made by the invention.

FIG. 1 diagrammatically shows a recording 2 of an event obtained with the aid of a high speed cinematographic camera. The term "event" is understood to mean the deformation or movement of an object, e.g. the movement of a bullet in the process of perforating a wall, or more generally any visible physical phenomenon, such as e.g. lightning. FIG. 1 shows as the event a sudden radial deformation of a cylinder observed along the face using a slit camera sighting a diameter of the cylinder, which leads to a recording 2 having a surface limited by two lines 3. The invention makes it possible to mark this recording with the aid of four regularly spaced, aligned points 4 facing a line 3 and preferably at the border of recording 2. The invention also makes it possible to mark a high speed cinematographic recording of an event with the aid of one or more points corresponding to interesting moments in said event. Obviously, the marker according to the invention is not limited to use with a slit camera, but can be used with any high speed cinematographic camera.

Figure 2:
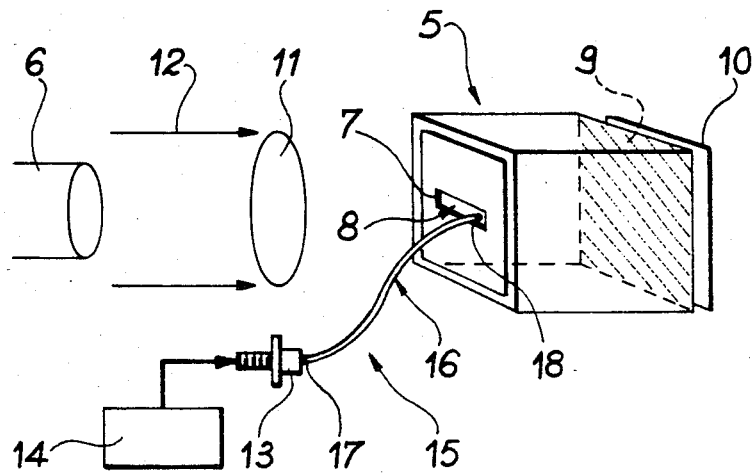
FIGS. 2 and 3 diagrammatic views of the special embodiments of the marker according to the invention, in the case where the latter is used with a slit electronic camera.

FIG. 2 diagrammatically shows a special embodiment of the marker according to the invention used with a slit electronic camera 5 for filming an event, such as the deformation of an object 6. Camera 5 has in per se known manner a slit 7, which defines the field of the camera, a photosensitive surface constituted by a photocathode 8 exposed to the field defined by slit 7 and a phosphor or fluorescent screen 9 in front of which is located a film 10 for obtaining a recording of the investigated event. Camera 5 also has an objective 11 located in front of slit 7 and which makes it possible to form the image of object 6 on photocathode 8 through slit 7. In FIG. 2, object 6 is located in the vicinity of objective 11, due to the limited size of FIG. 2. In practice, object 6 is much further from objective 7. It is for this reason that the light rays 12 from object 6 are represented as parallel lines.

For example, camera 5 is a camera marketed by THOMSON under reference TSN and which is equipped with a type S 20 or S 20R photocathode.

The marker according to the invention incorporates a power laser diode 13 operating in pulse-like manner electronic means 14 for controlling the diode and means 15 for transmitting to photocathode 8 light signals which the laser diode is able to emit. In the special embodiment of FIG. 2, these transmission means 15 comprise an optical fibre 16, whereof one end 17 is optically coupled to the laser diode and whose other end 18 is optically coupled to the cathode 8, at the border of the field defined by slit 7. The other end 18 of optical fibre 16 is, for example, fixed facing the photocathode 8 at one end of slit 7.

For example, the laser diode 13 is of the type having a simple or single heterojunction marketed by RCA under reference SG 2002A, whose peak power is approximately 9 W at 904 nm for a maximum duration of 200 ns.

Figure 3:
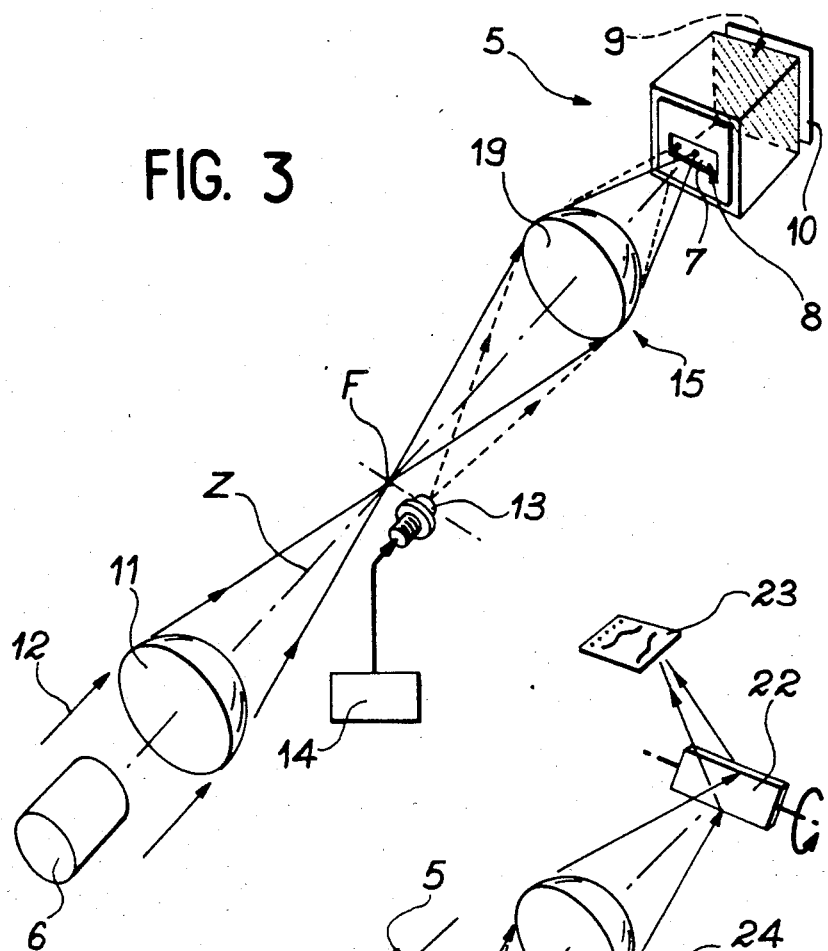

FIG. 3 diagrammatically shows another special embodiment of the marker according to the invention incorporating the laser doide 13 associated with the electronic control means 14 and cooperating with the electronic slit camera 5. In this other embodiment, the laser diode 13 is placed in the field defined by slit 7 and namely in the border area thereof and the transmission means 15 constituted by optics 19, such as a convergent lens, called a "image transfer lens" and located on the optical axis Z of the camera objective 11, between the latter and slit 7, in such a way that the light rays 12 from the object 6 are focused at a point F by objective 11 and are then transmitted on to the photocathode 8 via the image transfer lens 19. Laser diode 13 is positioned between the latter and objective 11, the emissive face of laser diode 13 being located in a plane passing through point F and perpendicular to axis Z, in such a way that a light signal emitted by the laser diode is focused on to one edge of the photocathode 8 via the image transfer lens 19.

Figure 4:
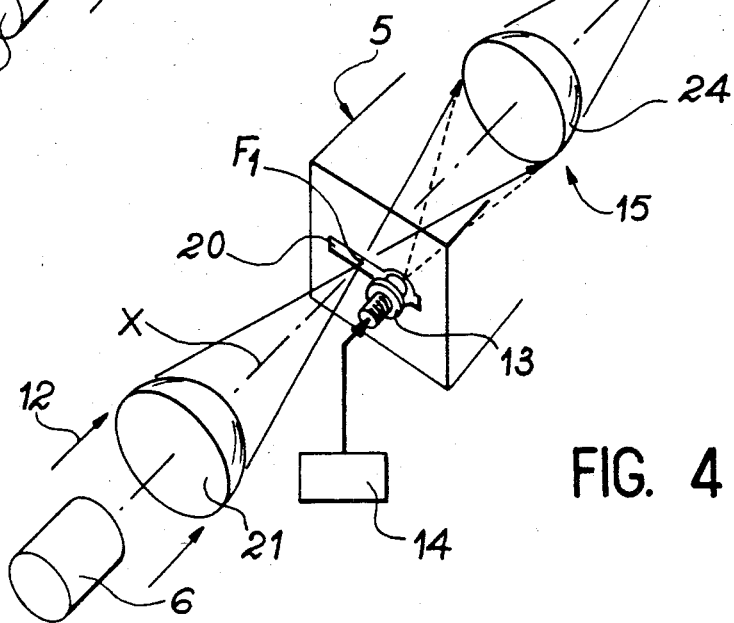
FIG. 4 a diagrammatic view of another special embodiment of the marker according to the invention, in the case where the latter is used with a mechanicooptical camera.

FIG. 4 diagrammatically shows another special embodiment of the marker according to the invention incorporating the laser diode 13 associated with the electronic control means 14 and cooperating with a mechanooptical, high speed cinematographic camera 5 having a slit 20 for defining the optical field of the camera, an objective 21 positioned in front of the slit 20 and a rotary mirror 22 able to reflect the image of the field defined by the slit on to a photosensitive support or film 23.

The transmission means 15 comprise a focusing optics 24 such as a convergent lens, located on the optical axis X of objective 21 between slit 20 and rotary mirror 22. The relative positioning of objective 21 and lens 24 are such that the light rays 12 from the investigated phenomenon, e.g. object 6 in the process of being deformed, are focused at a point $F_1$ of slit 20 and are then transmitted therefrom on to film 23 via lens 24 and then rotary mirror 22.

In the embodiment of FIG. 4, the laser diode 13 is selected in such a way as to emit light belonging to the visible region of the electromagnetic spectrum. The laser diode 13 is also placed in the border of the optical field defined by slit 20. For this purpose, the laser diode 13 is fixed to one edge of slit 20 in such a way that the light signals which it is able to emit are focused on one edge of film 23 via lens 24 and rotary mirror 22.

Figure 5:
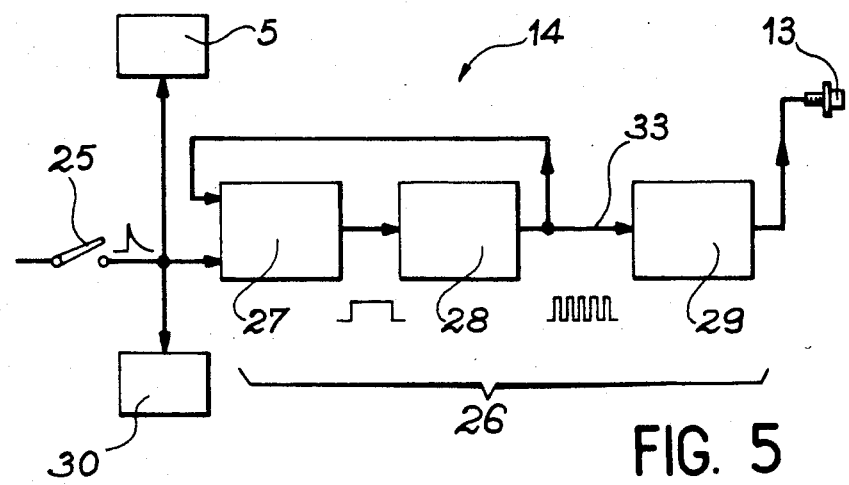
FIG. 5 a diagrammatic view of a special embodiment of the electronic control means for a marker according to the invention.

FIG. 5 diagrammatically shows a special embodiment of the electronic control means 15, in the case where use is made of a power laser diode operating in pulse-like manner. It comprises means 25 for synchronizing the operation of laser diode 13 with the start of the studied event and with the operation of camera 5, as well as means 26 for producing a given number of high intensity electrical pulses, whereof the sum of the duration is at the most equal to the maximum duration of a light pulse which the laser diode is able to emit. These production means 26 also comprise a pulse counter 27, an electric pulse generator 28 and a power amplifier 29.

Counter 27 comprises resetting means, which are connected to the synchronization means 25. The output of counter 27 is connected to the input of the electric pulse generator 28, whose output is connected to the input of power amplifier 29. The output of the latter is connected to the laser diode 13. Moreover, the output of pulse generator 28 is connected to one input of counter 27, so that it is dependent on the electric pulse generator 28.

The synchronization means 25 can be looked upon as a sort of switch controlling both the operation of the laser diode, the operation of the camera and means 30 making it possible to start the event to be studied. For example, in the case of the deformation of an object, said means 30 can comprise a detonator, whose explosion brings about the said deformation.

The electronic control means 14 operate as follows. The synchronization means 25 release counter 27, which in turn releases generator 28. Thus, generator 28 supplies electric pulses, whose intensity is amplified by the power amplifier 29, so as to obtain pulses having a high intensity, e.g. 10 A, so as to be able to supply the power laser diode. The electric pulses emitted by generator 28 are counted by counter 27. When a given number of pulses is obtained, counter 27 controls the stopping of generator 28 (via a logic gate forming part of the generator, the output of the counter being connected to said logic gate). Generator 28 has means for regulating the time separating two electric pulses, which it can emit and for regulating the duration of these pulses.

The given number of pulses is such that the sum of the durations thereof is at the most equal to the maximum duration of a light pulse which can be emitted by a laser diode. Counter 27 is regulated so as to count up to this given number.

For example, the laser diode marketed by RCA under reference SG 2002A is able to emit 200 ns pulses. The electronic control means 14 make it possible to subdivide such a 200 ns pulse into N pulses of 200 ns. The number N is, for example, equal to 20. It is possible to regulate generator 28 so as to separate each of these 20 pulses from the following pulse by a given time interval, e.g. equal to 1 $\mu$s, so as to obtain a regular marking for an event lasting approximately 20 $\mu$s.

Figure 6:
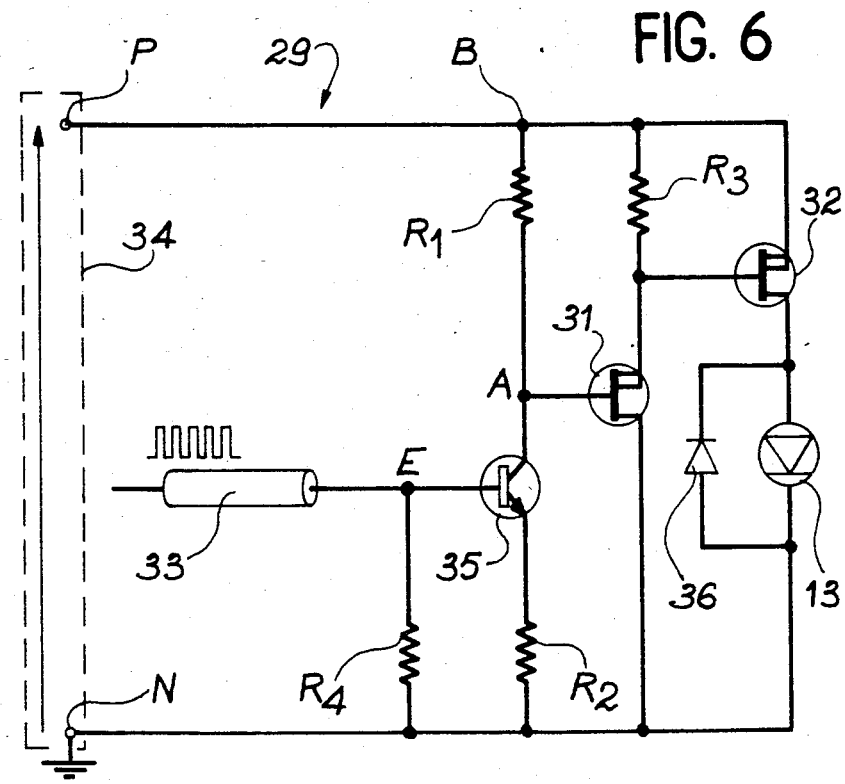
FIG. 6 a diagrammatic view of the special embodiment of a power amplifier equipping the electronic control means.

FIG. 6 diagrammatically shows a special embodiment of power amplifier 29. The latter is realized with the aid of two HMOS power transistors 31, 32. Input E of the power amplifier is connected to the output of the electric pulse generator 28 by a coaxial cable 30. In addition, power amplifier 29 is supplied by a direct current supply 34, whose negative pole N is earthed.

Power amplifier 29 firstly comprises an impedance matching gain stage realized with a type npn transistor 35. The base of this transistor is connected to input E. It is also connected to earth via an electrical resistor $R_4$. The collector of this transistor is connected to one end A of an electrical resistor $R_1$, the other end B of said resistor $R_1$ being connected to the positive pole P of supply 34. Finally, the emitter of transistor 35 is connected to earth via an electrical resistor $R_2$.

The power amplifier 29 finally comprises a stage operating as a follower source impedance reduceing stage, realized with the aid of a power amplifier 31. The gate of the latter is connected to end A of resistor $R_1$, whilst its drain is connected to earth. The souce of power transistor 31 is connected, via an electrical resistor $R_3$, to the positive pole P of supply 34.

Finally, power amplifier 29 comprises a stage for supplying the current gain, realized with the aid of the other power transistor 32, whose gate is connected to the connection between the source of power transistor 31 and electrical resistor $R_3$. Moreover, said other power transistor 32 is connected by its drain to the anode of laser diode 13 and by its source to the positive pole P of power supply 34.

The cathode of laser diode 13 is connected to earth. In order to prevent overvoltages at the terminals of said laser diode, a free wheel diode 36 is connected in head to tail manner with the laser diode 13 between the terminals of the latter.

In an illustrative and non-limitative manner, electrical resistors $R_1$, $R_2$, $R_3$ and $R_4$ have respective values 56, 5, 5 and 57 ohms. The voltage at the terminals of supply 34 is 15 V. Transistor 35 is the type marketed by RTC under reference 2N2219 A. The power laser diode is of the type marketed by RCA under reference SG 2002 A. The freewheel diode is of the type marketed by RTC under reference 1N4148 and the two power transistors 31, 32 are of the type marketed by INTERNATIONAL RECTIFIER under reference IRF 9520. The HMOS transistors could be replaced by DMOS transistors for forming power amplifier 29.

Figure 7:
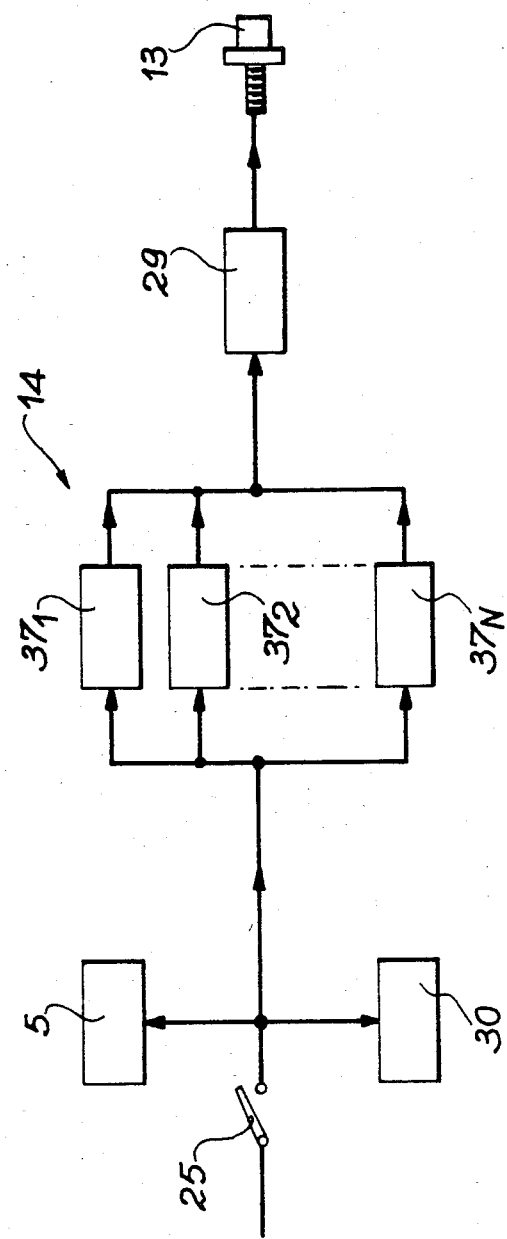
FIG. 7 a diagrammatic view of another special embodiment of the electronic control means.

FIG. 7 diagrammatically shows another special embodiment of the control means 14, which can be used in the case where it is only required to mark one or several specific instants of an event with the aid of a power laser diode 13 operating in pulse-like manner. Apart from the synchronization means 25 and the power amplifier 29 referred to hereinbefore, this embodiment comprises one or more regulatable monostable generators $37_1$, $37_2$, ... $37_N$, whereof the number N is equal to the number of precise instants to be marked and which can in each case produce a single electric pulse. The input of each monostable generator is connected to the synchronization means 25 and the output of each of these generators is connected to the input E of power amplifier 29, whose output is connected to the laser diode 13. Each monostable generator is regulated so as to produce, at a given time following the start of the event, an electric pulse of an appropriate duration, as well as in such a way that the sum of the durations of the pulses corresponding to the different monostable generators is at the most equal to the maximum duration of a light pulse which the laser diode can emit.

For example, in the case of an event lasting 20 μs, it may be desired to mark three instants occurring respectively 1, 5 and 10 μs following the start of the event. Use is then made of the three monostable generators which are regulated so that each produces a 20 ns pulse, respectively 1, 5 and 10 μs after the start of the event.

What is claimed is:

1. A marker for a high speed cinematographic camera wherein it comprises at least one power laser diode operating in pulse-like manner, electronic means for controlling each laser diode, enabling the latter to emit a light signal and means for transmitting this light signal to a photosensitive surface with which the camera is equipped.

2. A marker according to claim 1, wherein the camera is an electronic camera provided with a slit for defining the optical field of the camera and has a photosensitive surface exposed to the field defined by the slit.

3. A marker according to claim 2, wherein the laser diode is placed in the field defined by the slit, and specifically at the border thereof and wherein the transmission means comprise optics for focusing the signal through the slit on to the photosensitive surface.

4. A marker according to claim 2, wherein the transmission means comprises an optical fibre, whereof one end is optically coupled to the laser diode and whereof the other end is optically coupled to the photosensitive surface, at the border of the field defined by the slit.

5. A marker according to claim 1, wherein the camera is a mechanooptical camera provided with a slit for defining the optical field of the camera and wherein the laser diode is able to emit light belonging to the visible region of the electromagnetic spectrum.

6. A marker according to claim 5, wherein the camera has a rotary mirror able to reflect the image of the field defined by the slit on to a photosensitive support, wherein the laser diode is placed in this field at the border thereof and wherein the transmission means comprise optics for focusing the light signal on to the photosensitive support via the rotary mirror.

7. A marker according to claim 1, wherein the electronic control means comprise means for producing a given number of high intensity electric pulses, whereof the sum of the durations is at the most equal to the maximum duration of a light pulse which the laser diode can emit.

8. A marker for a high speed cinematographic camera intended to film an event, comprising, at least one power laser diode operating in pulse-like manner, electronic means for controlling each laser diode and causing the latter to emit a light signal, and means for transmitting said light signal to a photosensitive surface with which the camera is equipped, wherein said electronic control means comprises:

means for synchronizing the operation of the laser diode with the start of the event, an electric pulse generator, a pulse counter controlled by the synchronization means dependent on the pulse generator and controlling the same, in such a way that the pulse generator produces a given number of pulses, whereof the sum of the durations is at the most equal to the maximum duration of a light pulse which the laser diode is able to emit and stops once this number has been produced, and a power amplifier for amplifying the pulses from the pulse generator, the amplified pulses being transmitted to the laser diode.

9. A marker for a high speed cinematographic camera intended to film an event, comprising, at least one power laser diode operating in pulse-like manner electronic means for controlling each laser diode and causing the latter to emit a light signal, and means for transmitting said light signal to a photosensitive surface with which the camera is equipped, wherein said electronic control means comprises:

means for synchronizing the operation of the laser diode with the start of the event, at least one regulatable monostable electric pulse generator, each monostable generator having input connected to the synchronization means, and being controlled so as to emit at a given moment, following the start of the event, an electric pulse of an appropriate duration and in such a way that the sum of the durations of the pulses emitted by the monostable generators is at the most equal to the maximum duration of a light pulse which the laser diode is able to emit, and a power amplifier whose input is connected to the output of each monostable generator and whose output is connected to the laser diode.

10. A marker according to claim 8, wherein the power amplifier comprises HMOS or VMOS power transistors for amplifying the electric pulses received at its input.

11. A marker according to claim 10, wherein the power amplifier successively comprises an impedence matching gain stage, a follower source impedence lowering stage and a current gain supply stage, the two latter stages being realized with the aid of said power transistors.

12. A marker according to claim 9, wherein the power amplifier comprises HMOS or VMOS power transistors for amplifying the electric pulses received at its input.

13. A marker according to claim 12, wherein the power amplifier successively comprises an impedence matching gain stage, a follower source impedence lowering stage and a current gain supply stage, the two latter stages being realized with the aid of said power transistors.

* * * * *